LOW LEVEL DIRECT CURRENT AMPLIFIER

Filed Sept. 15, 1965

WITNESSES:

Leon M. Garman

James F. Young

INVENTORS
Robert H. Luppold Jr. and
Joseph Gill.
BY E. F. Possessky
ATTORNEY

United States Patent Office 3,435,355
Patented Mar. 25, 1969

3,435,355

LOW LEVEL DIRECT CURRENT AMPLIFIER

Robert H. Luppold, Jr., West Newton, and Joseph Gill, Upper St. Clair Township, Bridgeville, Pa., assignors, by mesne assignments, to Westinghouse Electric Corporation, Pittsburgh, Pa., a corporation of Pennsylvania Filed Sept. 15, 1965, Ser. No. 487,360
Int. Cl. H03f *3/14, 3/26, 1/02*
U.S. Cl. 330—9 8 Claims

ABSTRACT OF THE DISCLOSURE

A low level direct current amplifier includes an input floating potentiometer section which is coupled to an output amplifier section. A field effect transistor chopper in the potentiometer section is provided with substantially balanced time constants in the drain and source circuits with the gate to produce substantially balanced chopper spiking which is substantially cancelled through differential amplification of the chopper output. In the output amplifier section, a differential field effect transistor amplifier produces an output from which common mode correction signals are derived and selectively applied and from which an amplified ground reference output is generated.

BACKGROUND OF THE INVENTION

This invention relates to low level direct current amplifiers of the type having a chopper stabilized, floating potentiometer input and single-ended output.

The type of amplifiers with which the invention is concerned is often used in various types of control systems in which changes in the controlled variable from a preselected normal condition produce a differential voltage which is amplified and used to control a change in the variable to return it to the preselected normal condition. As a specific example, the amplifier may be used in the controls for a heating system. In such a system, a change in temperature of the heated area or material from a preselected temperature is used to produce a signal voltage which, when amplified, can be used to cause a greater or lesser amount of fuel to be delivered to the heating system, thereby causing the temperature of the heated area or material to return to the preselected normal temperature. Often the desired signal voltage is of extremely low amplitude.

Among the problems which occur in low level direct current amplifiers and which must be solved are zero drift or offset, common mode error, noise, narrow bandwidth limits and poor overload recovery.

It is customary in electrical low level direct current amplifiers to improve "zero stability" which is defined as the ability of the amplifier to produce no output when there is no input of the desired signal. This is usually accomplished by the use of choppers which convert the direct current component of any voltage input to the amplifier into a series of square-wave pulses by means of mechanical or electronic switching means. These pulses are amplified by a high gain, drift-free alternating current amplifier section; and the amplified pulses are demodulated by mechanical or electronic switching means synchronized with the chopper, filtered and applied back to the input of the direct current amplifier where the resultant direct current voltage is added to the alternating current component, if any, of the input voltage. This process results in the reduction of drift voltage in the direct current amplifier output by a factor equal to the gain of the alternating current amplifier section. The sum of the two inputs is further amplified and usually a ground referenced, single-ended output is supplied.

The present invention follows the general configuration outlined above but with notatable improvements in the chopper and in the final or output amplifier section. These improvements, which are achieved in part through the use of field effect transistors, are pointed out in the objects below and in the detailed description of the invention which follows.

In a field effect transistor an N-type region is diffused into a P-type substrate and a P-type gate is subsequently diffused into the N-type region producing at the P-N junctions two transition regions at each of which there exists a depletion layer devoid of free, mobile carriers. This type of transistor may also be made with the P and N regions reversed. The depletion layer may be increased by using a reverse-bias across the P-N junction. In the N-type channel device described above, this would mean applying a negative gate voltage. The transistor can be designed so that the depletion layer will extend deep enough with the application of reverse-bias to close the channel and produce an "OFF" condition. Reducing the bias will produce an "ON" condition. Thus, the field effect transistor may be used as a switch or chopper in direct current amplifiers. For use as an amplifier, the field effect transistor is biased at less than the cut-off bias. As an amplifier it is characterized by high input and output impedance and very low interelement capacitance. More detailed discussions of the field effect transistors, if desired, may be found in the art relating to transistors.

In prior-art direct current amplifiers, when either unipolar or bipolar conventional transistors have been used as switches in the chopper section, a voltage "spike" has been produced by differentiation of the chopper drive voltage in the RC circuit consisting of interelement capacitance and load resistance. This spike produced noise in the amplifier output which caused a direct current offset in amplifier output voltage and tended to produce amplifier saturation. Certain prior attempts to reduce this effect utilized two transistors back-to-back in a balanced network. This attempted solution was difficult because it required two devices with accurately matched circuit parameters.

SUMMARY OF THE INVENTION

The present invention employs a single field effect transistor chopper with resistors in both the drain and source circuits. The resistors are selected such that the RC time constant of the gate-to-drain capacitance, in combination with drain circuit resistance, is equal to the RC time constant of the gate-to-source capacitance in combination with source circuit resistance. This causes any differentiated chopper drive signal to appear at both the drain and source equally. Since the alternating current amplifier section which follows the chopper is a differential amplifier, one input to which is taken from the drain of the chopper and the other input to which is taken from the source of the chopper transistor, the voltage spikes resulting from differentiation of the chopper drive signal voltage appear at both inputs of the alternating current amplifier equally and do not affect the amplifier output. Further, the chopper is a semiconductor device and there is a leakage current which flows from drain to gate and from source to gate as a function of the drive voltage while the chopper is in the off condition. Reduction of DC offset is realized as the resistance in the drain and source circuits approach equality.

Improved output amplifier zero and gain stability and common mode signal rejection are also obtained in this invention by utilizing a matched set of field effect transistors connected as a differential amplifier as the input stage of the output amplifier section and by providing a common mode amplifier stage which provides feedback to improve common code rejection in the output amplifier stages and which also provides a common mode output that may be used to drive shielding around ground isolated leads and components. Usually the shielding on ground isolated leads and components is connected to ground. In such event there exists between the shielding and the leads and components a potential equivalent to any common mode voltage appearing on the leads and components. This potential will cause current flow through the distributed capacitance between the shielding and the leads and components. If such current flows in the differential amplifier input circuits, an unwanted signal voltage will appear which is proportional to the degree of impedance unbalance between the two input circuits. Consequently, there will be an error in the amplifier output and a tendency toward amplifier saturation. If common mode voltage is applied to the shielding, the potential on a common mode basis between the shielding and the shielded leads and component will be zero and no current will flow on a common mode basis. By eliminating the leakage path to ground, this arrangement provides better isolation of the amplifier from ground. Therefore, the result of driving the shielding with common mode voltage is to effectively eliminate current flow on a common mode basis between the shielding and the leads or other components and consequently to eliminate the bad effects produced by such current flow.

The overall object of this invention is to produce a low level direct current amplifier having improved common mode signal rejection, noise elimination and zero stability.

Other objects of this invention are:

To provide a low level direct current amplifier using a single field effect transistor as the chopper so connected as to avoid amplifier offset and saturation due to differentiation of the chopper drive signal and due to chopper leakage currents when the chopper is off.

To provide a low level direct current amplifier using reverse feedback of common mode voltage to provide nearly perfect common mode rejection.

To provide a low level direct current amplifier having a true differential amplifier section employing matched field effect transistors.

To provide such an amplifier having a stage for common mode voltage amplification and which supplies common mode output which may be used to drive shielding on leads and components isolated from ground to further improve common mode rejection.

These and other objects and advantages of the invention will become readily apparent as it becomes better understood by reference to the following detailed description when considered in connection with the accompanying drawings:

DESCRIPTION OF THE PREFERRED EMBODIMENT

Figures 1, 2:
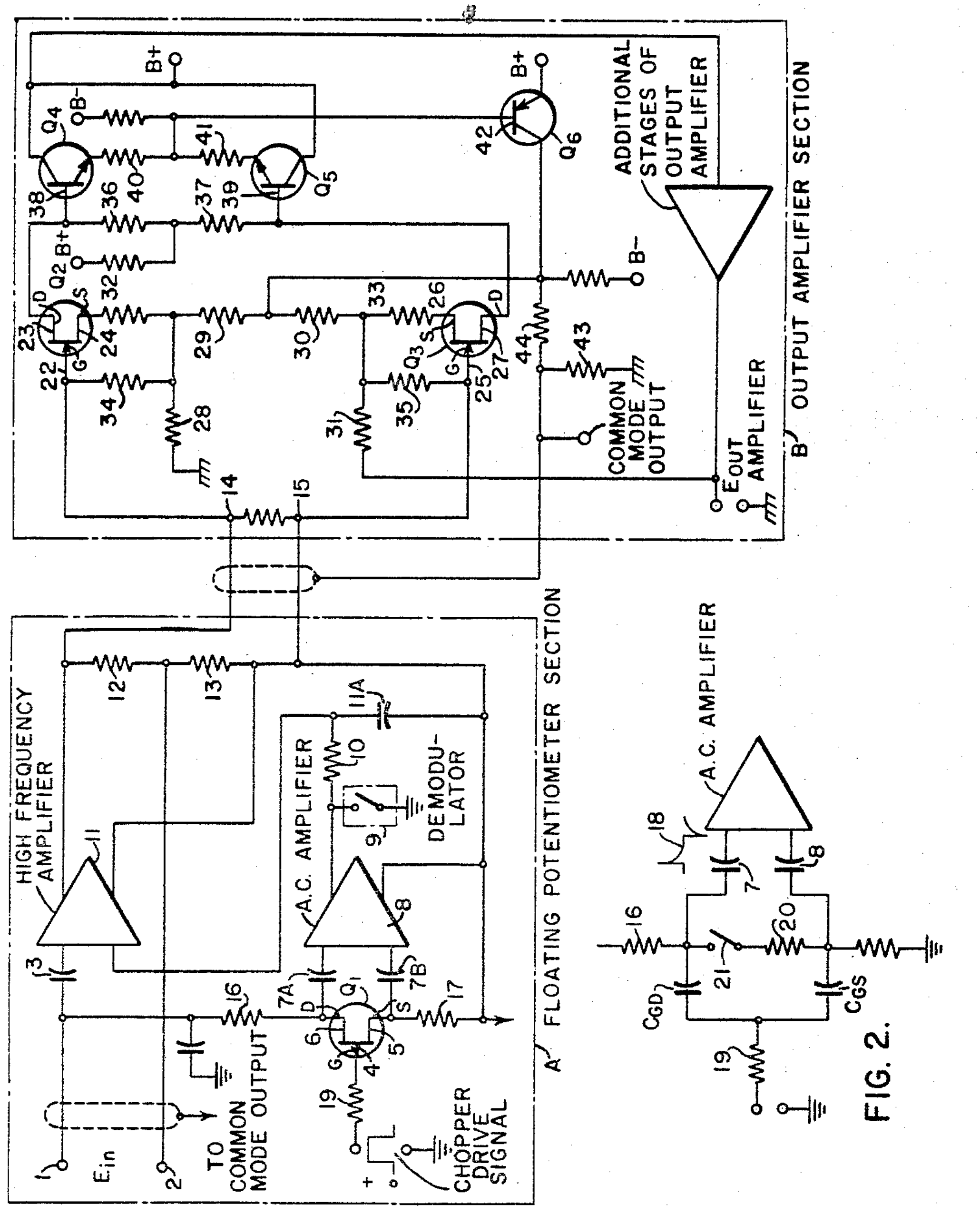
FIG. 1 is a schematic circuit drawing of a low level direct current amplifier constructed according to the invention with portions shown in block diagram form.
FIG. 2 is a schematic circuit drawing of the approximate equivalent circuit in the "ON" condition of the field effect transistor used as the chopper in the present invention.

Referring now to FIG. 1, there is shown a direct current amplifier consisting of an electrically floating potentiometer section A and an output amplifier section B. Numerals 1 and 2 designate the input terminals of the direct current amplifier to which may be applied a signal voltage $E_{in}$ which may be the voltage developed across a thermocouple or some other signal source. The direct current component of $E_{in}$ will be blocked by capacitor 3 and will be modulated by the action of chopper transistor $Q_1$. Chopper transistor $Q_1$ is a field effect transistor having gate 4, source 5 and drain 6. The transistor $Q_1$ is driven between an "ON" and "OFF" condition by application of a positive square-wave drive signal having its base at a zero voltage potential and rising to a predetermined positive voltage level as shown in the drawings in FIG. 1. The drain 6 and source 5 of chopper transistor $Q_1$ are connected through capacitors 7A and 7B to the input circuits of the alternating current or chopper amplifier 8 which is connected as a differential amplifier. The output voltage of the chopper amplifier is demodulated by a demodulator 9 which is shown schematically as a switch, then filtered by a network consisting of resistor 10 and capacitor 11A and fed to the high frequency amplifier 11 where it is added to any alternating current component of $E_{in}$ which was directly coupled through capacitor 3. The output of the high frequency amplifier 11 is developed across a voltage divider network consisting of resistors 12 and 13, the junction of which is connected to input terminal 2. As is well known in the art, the gain G of the floating potentiometer section can be shown to be represented by the formula $$G=\frac{R_{12}+R_{13}}{R_{13}}$$

where $R_{12}$ and $R_{13}$ are the resistances of elements 12 and 13, respectively. Therefore, the gain can be readily and accurately controlled by controlling the values of resistors 12 and 13. For any given values of $R_{12}$ and $R_{13}$ the gain is constant.

The output of the floating potentiometer section is applied to the input terminals 14 and 15 of the output amplifier section B. The first stage of the output amplifier section consists of a matched pair of field effect transistors $Q_2$ and $Q_3$ connected as a differential stage and driving a second differential stage consisting of standard bipolar transistors $Q_4$ and $Q_5$. The transistor $Q_6$ acts as a variable current source and provides common mode feedback to the sources of $Q_2$ and $Q_3$ and also provides a common mode output which can be used to drive shielding as described above. With common mode feedback to the sources of $Q_2$ and $Q_3$, and since the field effect transistors $Q_2$ and $Q_3$ have a characteristically high input impedance, virtually no current is drawn from the common mode source. Any current drawn on a common mode basis must pass through the feedback and input networks in the floating potentiometer section. This would cause amplifier saturation and zero offset. Since virtually no current is drawn on a common mode basis, the amplifier has improved zero stability, reduced tendency toward saturation and improved gain stability. This is in part due to the use of field effect transistors as the output amplifier input stage.

A better understanding of the unique characteristics of the chopper may be had by referring to FIG. 2 which shows an approximate equivalent circuit for the chopper transistor. In this equivalent circuit 19 represents a resistor in series with the gate of field effect transistor $Q_1$, $C_{GD}$ represents the gate-to-drain capacitance, resistor 20 represents the drain to source resistance of transistor $Q_1$ in the "ON" condition and switch 21 is used to represent the "ON" and "OFF" characteristic of the chopper transistor. It can be seen that the drain circuit resistor 16 and the gate-to-drain capacitance $C_{GD}$ form an RC differentiating network in which there is generated an induced voltage $E_i$ when the leading edge of the square-wave drive voltage is applied to the gate of $Q_1$. This voltage $E_i$ is equal to $$R_D C_{GD}\frac{de}{dt}$$

where $R_D$ is the drain resistance. Since the leading edge of the drive voltage rises sharply, the rate of change of voltage, *de/dt*, is large. Therefore, a large positive voltage spike is produced at the drain of $Q_1$. In comparable manner, as the voltage at the trailing edge of the drive signal falls rapidly to zero, a negative voltage spikes is produced. Voltage curve 18 shows the voltage which appears on the drain of $Q_1$ as a result of differentiation of the drive voltage as described above. The effect of these spikes is to produce undesirable noise, saturation of the amplifier and direct current offset of the output voltage.

This invention provides means for reducing the height of the voltage spikes and for substantially eliminating their effects. Resistor 19 in the gate circuit of $Q_1$ causes a reduction in the value of the fraction $de/dt$ applied to the RC differentiating networks and consequently also reduces the amplitude of the voltage spikes produced by the sharp rise and fall of the chopper drive voltage. Further means are provided as described below which effectively cancel the effect of the differential voltage spikes on the output of the chopper. These means consist of a resistor 17 in the source circuit such that the RC time constant of resistor 17 and the gate to source capacitance $C_{GS}$ is equal to the RC time constant of resistor 16 and the gate-to-drain capacitance $C_{GD}$. Therefore, the induced voltage spikes produced in the drain and source circuits by the application of chopper drive signal will be equal. Since the alternating current amplifier is connected as a differential amplifier and its inputs are taken from the drain and source of $Q_1$, the undesirable voltage transients caused by differentiation of chopper drive signal will appear equally at both inputs of the alternating current amplifier and will have no effect on its output voltage. Further, when the chopper is in the off condition leakage voltage drop across the resistors 16 and 17 can approach equality. In this manner, noise, direct current offset and saturation due to differentiation of the chopper drive signal are substantially eliminated by this invention.

Referring now to the output amplifier section, transistor $Q_2$ is a field effect transistor having gate 22, drain 23 and source 24 and transistor $Q_3$ connected with transistor $Q_2$ to form a differential amplifier stage has gate 25, drain 27 and source 26. The output of the output amplifier section is single-ended with earth as a reference. Resistors 28, 29, 30 and 31 connected between earth and the output of the output amplifier section form feedback networks to stabilize the amplifier gain, resistors 28 and 29 forming the network for transistors $Q_2$ and resistors 30 and 31 forming the feedback network for transistor $Q_3$. Self-bias for transistors $Q_2$ and $Q_3$ is developed by resistors 32 and 33, respectively. Feedback is applied so that the voltage across gate resistors 34 and 35 is maintained at a substantially fixed value. As is well known in the art, the gain G of the output amplifier section can be shown to be represented by the formula $$G=\frac{R_{31}+R_{30}}{R_{30}}=\frac{R_{28}+R_{29}}{R_{29}}$$

By selecting these resistors with very close tolerances, the gain of the output amplifier section can be very accurately maintained.

With common mode voltage applied to transistors $Q_2$ and $Q_3$ there will be a change in the voltage level at the drains of $Q_2$ and $Q_3$ proportional to the common mode voltage developed across resistors 36 and 37 which will be applied to the bases 38 and 39 of transistors $Q_4$ and $Q_5$, respectively, and transmitted through the resistors 40 and 41 in the emitter circuits of $Q_4$ and $Q_5$ to the base 42 of transistor $Q_6$. Transistor $Q_6$ acts as a variable current source supplying current to the first differential stage made up of transistors $Q_2$ and $Q_3$ and to the feedback networks made up of resistors 28 and 29 and resistors 30 and 31 on a common mode basis. With a high common mode loop gain the common mode feedback voltage will be substantially equal to the applied common mode voltage, the common mode input impedance will be extremely high and there will be virtually no input current on a common mode basis to the output amplifier section. Field effect transistors are used as the input stage because of their high input impedance compared to conventional transistors. Transistor $Q_6$ also supplies current on a common mode basis to resistors 43 and 44 which are selected in accordance with the common mode loop gain so that the voltage at the junction of resistors 43 and 44 is equal to the common mode input voltage. This provides a common mode output voltage available to drive the floating potentiometer shielding, cable shielding and shielding on any other components of the direct current amplifier to provide better isolation from ground and improved common mode rejection.

From the above description it may readily be seen that there is produced by this invention a low level direct current amplifier with improved common mode signal rejection, noise rejection and zero stability.

We claim as our invention:

1. A chopper stabilized low level direct current amplifier having an input to which a low level direct current input signal is applied, said direct current amplifier comprising a chopper amplifier having a differential amplifier input stage, a chopper circuit, means for coupling the direct current amplifier input to said chopper circuit to provide for amplifying the low level direct current input signal to the chopper amplifier output level, said chopper circuit including a field effect transistor having drain and source output terminals and a gate terminal, means for driving said field effect transistor, means coupled to said field effect transistor in said chopper circuit for substantially equating the gate-to-drain and gate-to-source circuit time constants, means for coupling the source and drain terminals of said field effect transistor to the differential input stage of said chopper amplifier, and means for further amplifying the chopper amplified DC input signal to generate a direct current amplifier output.

2. A chopper stabilized low level direct current amplifier as set forth in claim 1 wherein said equating means includes drain resistance means connected in a path coupled to the drain terminal and source resistance means connected in a path coupled to the source terminal, and said drain and source resistance means are selected in value to provide substantial equalization of the circuit time constants.

3. A low level direct current amplifier comprising a potentiometer section electrically isolated from ground and a ground referenced output amplifier section, said output amplifier section having a first stage comprising a pair of field effect transistors connected as a differential amplifier stage, means for coupling the output of said potentiometer section to an input of the differential amplifier stage of said output amplifier section, means responsive to the output of the differential amplifier stage of said output amplifier section for generating a common mode voltage control signal proportional to common mode voltage applied to the input of the differential amplifier stage of said output amplifier section, means for applying a signal derived from the common mode voltage control signal to shielding associated at least with said potentiometer section, and means for further amplifying the output of the differential amplifier stage of said output amplifier section to generate a ground referenced amplified output signal.

4. A low level direct current amplifier as set forth in claim 3 wherein means is provided for applying a common mode feedback signal derived from the common mode control signal to the input circuitry of the field effect transistor differential amplifier stage so as to offset common mode voltage applied thereto from said potentiometer section.

5. A low level direct current amplifier comprising a chopper stabilized potentiometer section electrically isolated from ground and a ground referenced output amplifier section, said output amplifier section having a first stage comprising a pair of field effect transistors connected as a differential amplifier stage, means for coupling the output of said potentiometer section to an input of the differential amplifier stage of said output amplifier section, means responsive to the output of the differential amplifier stage of said output amplifier section for generating an inverse feedback voltage proportional to common mode voltage applied to the input of the differential amplifier stage of said output amplifier section, means for coupling the inverse feedback voltage signal to the input circuitry of the differential amplifier stage of said output amplifier section so as to offset common mode voltage applied to the differential amplifier stage input from said potentiometer section, and means for further amplifying the output of the differential amplifier stage of said output amplifier section so as to generate a ground referenced amplified output signal.

6. A chopper stabilized low level direct current amplifier as set forth in claim 2 wherein gate resistance means is connected in a path coupled to the transistor gate terminal to reduce the amplitude of transistor interterminal voltage spikes caused by operation of said driving means.

7. A chopper stabilized low level direct current amplifier as set forth in claim 4 wherein said potentiometer section is provided with an input to which a low level direct current input signal is applied, a chopper amplifier is included in said potentiometer section, said chopper amplifier is provided with a differential amplifier input stage, a chopper circuit is included in said potentiometer section, means are provided for coupling the potentiometer section input to said chopper circuit to provide for amplifying the low level direct current input signal to the chopper amplifier output level, said chopper circuit includes a field effect transistor having drain and source output terminals and a gate terminal, means are provided for driving said chopper field effect transistor, means are coupled to said field effect transistor in said chopper circuit for substantially equating the gate-to-drain and gate-to-source circuit time constants, means are provided for coupling the source and drain terminals of said chopper field effect transistor to said chopper amplifier differential input stage, and means are provided in said potentiometer section for further amplifying the chopper amplified direct current input signal.

8. A low level direct current amplifier comprising an input potentiometer section and an output amplifier section having a differential amplifier as its input stage, means for coupling said potentiometer section to the input of said differential amplifier, means responsive to the output of said differential amplifier for generating a common mode control signal upon the application of common mode voltage to the input of said differential amplifier, and means responsive to said generating means for applying at least one corrective signal derived from the common mode control signal to at least one predetermined amplifier circuit potential point selected from a potentiometer section shielding point and a point in the input circuitry of said differential amplifier.

References Cited

UNITED STATES PATENTS

| | | | |
|---|---|---|---|
| 2,994,825 | 8/1961 | Anderson | 330—9 X |
| 3,281,718 | 10/1966 | Weberg | 330—9 X |

OTHER REFERENCES

SCP and Solid State Technology, April 1964, pp. 13–18, "Field Effect Transistors as Choppers," by Fattal.

Electronic Engineering, February 1965, pp. 80–83, "The Feld Effect Transistor Used as a Low-Level Chopper," by Barton.

NATHAN KAUFMAN, *Primary Examiner.*

U.S. Cl. X.R.

330—38, 15